(12) United States Patent
Tuller et al.

(10) Patent No.: US 6,544,674 B2
(45) Date of Patent: Apr. 8, 2003

(54) STABLE ELECTRICAL CONTACT FOR SILICON CARBIDE DEVICES

(75) Inventors: Harry L. Tuller, Wellesley, MA (US); Marlene A. Spears, Woburn, MA (US); Richard Micak, Cambridge, MA (US)

(73) Assignee: Boston MicroSystems, Inc., Woburn, MA (US)

( * ) Notice: Subject to any disclaimer, the term of this patent is extended or adjusted under 35 U.S.C. 154(b) by 0 days.

(21) Appl. No.: 09/940,064

(22) Filed: Aug. 27, 2001

(65) Prior Publication Data

US 2002/0068488 A1 Jun. 6, 2002

Related U.S. Application Data

(60) Provisional application No. 60/228,740, filed on Aug. 28, 2000.

(51) Int. Cl.[7] .......................... H01R 3/00; H01L 21/00; B32B 9/00
(52) U.S. Cl. ................. 428/698; 428/469; 428/697; 428/446; 438/571; 438/572; 438/583; 438/597; 439/884
(58) Field of Search ................. 428/698, 697, 428/469, 446; 438/571, 572, 582, 583, 597–607, 618, 666; 439/884

(56) References Cited

U.S. PATENT DOCUMENTS

| | | | | |
|---|---|---|---|---|
| 4,961,529 A | * | 10/1990 | Gottselig et al. | 228/124 |
| 5,882,561 A | * | 3/1999 | Barsoum et al. | 264/65 |
| 5,980,265 A | | 11/1999 | Tischler | 437/185 |

FOREIGN PATENT DOCUMENTS

| | | | |
|---|---|---|---|
| DE | 0038119451 A1 | * | 10/1989 |
| JP | 63274665 A | * | 11/1988 |

OTHER PUBLICATIONS

Barsoum, M.W., "The $M_{N+1}AX_N$ Phases: A New Class of Solids; Thermodynamically Stable Nanolaminates," *Prog. Solid St. Chem.*, 28: 201–281 (2000). No Month.

Barsoum, M.W., et al., "Thermal Properties of $Ti_3SiC_2$," *J. of Phys. And Chem. Of Solids* 60,: 429–439 (1999). No Month.

Goesmann, F., et al., "Temperature–Dependent Interface Reactions and Electrical Contact Properties of Titanium on 6H–SiC," *Semicond. Sci. Technol.*, 10: 1652–1658 (1995). No Month.

Goesmann, F., et al., "Metallization Studies on $Ti_3SiC_2$–Based Contacts on 6H–SiC," *J. of Materials Sci., Materials in Elec.*: 103–107, article received Jul. 18 and accepted Nov. 9, 1997, (1998). No Month.

Goesmann, F., et al., "Metals on 6H–SiC: Contact Formation from the Materials Science Point of View," *Materials Sci. and Eng. B46*: 357–362 (1997). No Month.

Radhakrishnan, R., et al., "Synthesis and High–Temperature Stability of $Ti_3SiC_2$," *J. of Alloys and Compounds*, 285: 85–88 (1999). No Month.

* cited by examiner

Primary Examiner—Deborah Jones
Assistant Examiner—Stephen Stein
(74) Attorney, Agent, or Firm—Hamilton, Brook, Smith & Reynolds, P.C.

(57) ABSTRACT

An electrical contact for a silicon carbide component comprises a material that is in thermodynamic equilibrium with silicon carbide. The electrical contact is typically formed of $Ti_3SiC_2$ that is deposited on the silicon carbide component.

33 Claims, 2 Drawing Sheets

STABLE ELECTRICAL CONTACT FOR SILICON CARBIDE DEVICES

RELATED APPLICATION

This application claims the benefit of U.S. Provisional Application No. 60/228,740, filed on Aug. 28, 2000. The entire teachings of the above application are incorporated herein by reference.

GOVERNMENT SUPPORT

The invention was supported, in whole or in part, by a grant NAS 3 99013 from National Aeronautics and Space Administration. The Government has certain rights in the invention.

BACKGROUND

Electronic or electrical devices can be subjected to elevated temperatures in applications such as down-well drilling, in high power electronics, and in the automotive, aerospace, and process industries. Electronic devices fabricated from traditional materials used in the microelectronics industry, for example, a silicon semiconductor device with electrical contacts formed from aluminum, titanium, etc., are either unable to operate under high temperature conditions or deteriorate rapidly.

Silicon carbide (SiC) is presently under development for use in electronic devices that are subjected to high temperatures. Silicon carbide's material properties (large band-gap, high thermal conductivity, extremely high melting and decomposition temperatures, excellent mechanical properties, and exceptional chemical stability) exceed those of silicon and make it suitable for operation in hostile environments. Operation of SiC as semiconductor material, for example, is possible to temperatures as high as 1000° C. due to a band gap nearly 3 times larger than silicon (3.26 eV for 4H—SiC), thereby insuring low intrinsic carrier concentrations and operation within the dopant-controlled saturation regime required for semiconducting devices.

While SiC is stable and capable of functioning at elevated temperatures as well as in corrosive environments, a barrier to the widespread use of SiC-based microelectronics and microelectromechanical devices for high temperature applications has been the lack of stable electrical contacts thereon for making electrical connection to the devices. Virtually all metals, including the standard contact/electrode materials used in silicon-based devices (Al, Cr, Au, Ti, Pt, W, etc.), react with silicon carbide at elevated temperatures to form metal silicides and/or carbides. At a minimum, when an SiC device having such metal contacts is subjected to elevated temperatures above approximately 400° C. (depending on the metals), such reactions begin to change the resistance between the SiC and the contacts thereon. Over time, as the reactions continue, the change in resistance increases, which affects the device's performance. In more extreme cases, the entire contact layer degrades due to various combinations of: oxidation, decomposition, melting, evaporation, reaction with SiC and/or balling up on the surface.

Compositions, including metallic and refractory compound films such as TiW, TiN and TaC, have also been attempted for use as contacts on SiC devices. In some approaches, films such as Ni, W, Ti, Al, or Pt are first deposited on and then reacted with the SiC devices at temperatures well above the device operation temperature (about 900–1100° C.) to pre-form a more stable reaction layer. In other approaches, multilayer structures are utilized. The layers may, for example, serve to reduce the contact resistance, provide diffusion/reaction barriers, provide oxidation barriers, etc. However, these approaches suffer from intrinsic thermodynamic instability and do not form a stable electrical contact to the SiC surface. Consequently, due to reactions occurring at elevated temperatures, the layers have limited 1) lifetime, 2) maximum operating temperature, and/or 3) stability of device performance in the intended environment.

SUMMARY

The present invention provides an electrical contact for a silicon carbide (SiC) device or component including titanium silicon carbide ($Ti_3SiC_2$) material that is in thermodynamic equilibrium with SiC. This allows SiC devices to be operated in high temperature environments without the contact material reacting with the SiC, and the performance of the device deteriorating.

In preferred embodiments, the $Ti_3SiC_2$ is deposited on the SiC device. In some embodiments, the $Ti_3SiC_2$ material further includes at least one of zirconium (Zr), hafnium (Hf), aluminum (Al), germanium (Ge), chromium (Cr), vanadium (V), niobium (Nb), tantalum (Ta), molybdenum (Mo), scandium (Sc), gallium (Ga), indium (In), thallium (Tl), tin (Sn), lead (Pb), phosphorous (P), arsenic (As), sulfur (S), and nitrogen (N). In one embodiment, the electrical contact is an ohmic contact and in another embodiment, the electrical contact is a schottky contact.

The present invention is also directed to a semiconductor device including an SiC component and at least one electrical contact formed over at least a portion of the SiC component. The electrical contact is formed of a material that is in thermodynamic equilibrium with SiC. In preferred embodiments, the material comprises $Ti_3SiC_2$ which is deposited on the SiC component. In some embodiments, the $Ti_3SiC_2$ material further includes at least one of Zr, Hf. Al, Ge, Cr, V, Nb, Ta, Mo, Sc, Ga, In, Tl, Sn, Pb, P, As, S, and N.

In some embodiments, the SiC component is formed on a substrate layer. The SiC component or the substrate layer can be a micromechanical structure. The SiC component can include at least one doped SiC epitaxial layer formed on a portion of an underlying SiC layer to form a mesa. The SiC component can further include at least one doped SiC region implanted into the underlying SiC layer, wherein the at least one implanted SiC region and epitaxial layer each have an electrical contact thereon. The SiC component can also include an SiC substrate and an SiC buffer layer formed on the SiC substrate, wherein the underlying SiC layer is formed over the SiC buffer layer.

In another embodiment, the SiC component has an electrical contact on opposite sides thereof. The SiC component includes an SiC epitaxial layer formed on an SiC substrate. In yet another embodiment, at least one metallic layer is formed over at least a portion of at least one electrical contact. The at least one metallic layer forms at least one of a bondable layer for bonding electrical leads thereto, a diffusion barrier for preventing reaction with the at least one electrical contact, and an adhesion layer for promoting adherence of films deposited thereon.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
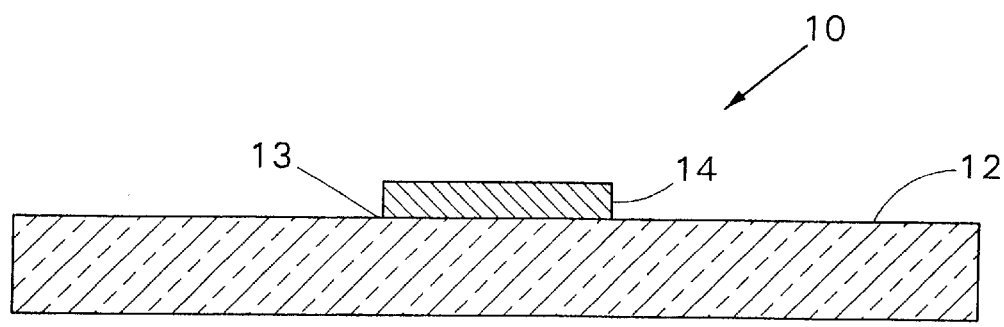
FIG. 1 is a schematic side view of a stable electrical contact formed on an SiC semiconductor device or component in accordance with the present invention.

Referring to FIG. 1, in the present invention, electrical or electronic device 10 is a device which can be employed in high temperature and/or corrosive environments with little or no deterioration or change in performance. Electrical device 10 can be one of many devices such as an actuator, a sensor, an electronic or optical device, etc. Electrical device 10 includes a high temperature resistant silicon carbide (SiC) semiconductor device or component 12 and at least one stable high temperature resistant electrical contact 14 formed on the SiC component 12 for allowing electrical contact to be made to electrical device 10. The SiC component 12 can be one of many semiconductor components or devices such as a piezoresistor, a diode, a transistor, etc. The electrical contact 14 is primarily formed of the conductive ternary compound, titanium silicon carbide ($Ti_3SiC_2$). This material is in thermodynamic equilibrium with SiC and will not react with SiC at elevated temperatures. Consequently, the electrical device 10 can be operated in high temperature environments (typically up to 1200° C.), with no reactions occurring across the mating junction 13 of the SiC component 12 and the electrical contact 14. As a result, the operation of electrical device 10 can remain consistent at such elevated temperatures because the resistance across the junction 13 will experience little or no change over time. Although the electrical contact 14 and SiC component 12 will not react with each other, when temperatures surrounding electrical device 10 reach 800° C.–900° C., the electrical contact 14 and/or SiC component 12 may begin to react with other elements that are present in the surrounding environment, such as oxygen.

The electrical contact 14 is typically formed on the SiC component 12 by first cleaning the surface of the SiC component 12 to remove any oxide layers and absorbed organic compounds, and then depositing single phase layers of $Ti_3SiC_2$ material thereon. The $Ti_3SiC_2$ material is typically deposited by methods such as sputtering, pulsed laser deposition, chemical vapor deposition, etc. The stoichiometry and microstructure of the electrical contacts 14 can be controlled. In one embodiment, pulsed laser deposition is the preferred method of depositing the $Ti_3SiC_2$ material because the stoichiometry is preserved. When the $Ti_3SiC_2$ is deposited, there is no reaction with or consumption of the SiC material on which the contacts 14 are formed. Typically, when forming low resistance or ohmic contacts 14 on the SiC component 12, the region of the surface on which the contact 14 is formed preferably has a high doping density of $N_a$ or $N_d > 10^{19}$, where $N_a$ and $N_d$ are acceptor and donor dopant densities, respectively. After the contacts 14 are formed, the electrical device 10 is then heated in an inert gas environment for annealing purposes. Electrical contact 14 can be patterned with standard photolithographic processes to form contact pads and conducting traces.

$Ti_3SiC_2$ itself is thermodynamically stable to at least 1700° C. and remains thermally stable with SiC at all temperatures in which both compounds are themselves thermodynamically stable. $Ti_3SiC_2$ shows little or no reactions with most common acids and bases including sulfuric, hydrochloric and hydrofluoric acid, and sodium hydroxide. $Ti_3SiC_2$ is an excellent electronic conductor with resistivities that are comparable to Ti metal ($\rho(300K) \sim 0.4\ \mu\Omega$-m) and is also an excellent thermal conductor (k~35 W/m.K) with a thermal conductivity exceeding that of Ti metal. In contrast to most refractory carbides/silicides, $Ti_3SiC_2$ is elastically rigid as well as relatively soft and light. The thermal expansion coefficient of $Ti_3SiC_2$ is roughly twice that of SiC and can accommodate thermally induced stresses and shock. $Ti_3SiC_2$ exhibits oxidation resistance to very high temperatures by forming a thin, dense, adherent scale which is resistant to thermal cycling. The oxygen diffusivity is estimated to be $10^{-18}$ m$^2$/s at 1200° K. Oxidation of $Ti_3SiC_2$ follows a parabolic rate law over the temperature range of 900–1400° C. in air with an activation energy of approximately 4 eV, and it is estimated that after 1000 hours at 1100° F. (593° C.), the oxide film thickness will be only approximately 11 nm thick. The oxidation product is typically a conformal protective layer of $TiO_2/SiO_2$.

The $Ti_3SiC_2$ material forming electrical contact 14 can include other elements such as zirconium (Zr), hafnium (Hf), aluminum (Al), germanium (Ge), chromium (Cr), vanadium (V), niobium (Nb), tantalum (Ta), molybdenum (Mo), scandium (Sc), gallium (Ga), indium (In), thallium (Tl), tin (Sn), lead (Pb), phosphorous (P), arsenic (As), sulfur (S), and nitrogen (N). $Ti_3SiC_2$ is one of a family of ternary layered compounds with the general formula $M_{N+1}AX_N$, where N is 1, 2 or 3 and X is either carbon or nitrogen. Zr, Hf, Al, Ge, Cr, V, Nb, Ta, Mo, Sc, Ga, In, Tl, Sn, Pb, P, As, S, and N are all components of this family of materials and thus can form solid solutions with $Ti_3SiC_2$ with the same or closely related crystalline structure. Such elements can be employed to modify properties of the electrical contact 14, for example, to make the electrical contact 14 to the SiC component 12 more ohmic or more schottky-like, to change the resistance of electrical contact 14, to change the thermal expansion coefficient of the $Ti_3SiC_2$ material, to change the bulk electrical conductivity of the $Ti_3SiC_2$ material, to improve the stability of the $Ti_3SiC_2$ material to chemically aggressive environments, etc. When these elements are added, the elements can replace a percentage of a particular element of the $Ti_3SiC_2$ material. For example, when adding trace elements, 1% of the Si can be replaced by Ge or Al, or 1% of the Ti with Zr or Hf. In addition, larger percentages of elements can be substituted or added, for example, up to 5%, up to 10%, etc. Although Zr, Hf, Ge and Al are the most typical elements added, the $Ti_3SiC_2$ material can contain other elements. These other elements can be in trace amounts which are present either intentionally or unintentionally. Adding certain elements can make the electrical contact 14 slightly reactive with the SiC component 12. Consequently, solid solutions of such elements can be included in the $Ti_3SiC_2$ material to control certain properties, at the expense of stability at high temperatures. It is understood that the electrical contact 14 is considered to be formed of $Ti_3SiC_2$ even when containing other elements.

It is also possible to deposit a thin film of metal (a few angstroms to a few hundred angstroms) such as titanium (Ti) onto the SiC component 12 surface prior to depositing the $Ti_3SiC_2$ material to modify the properties of the electrical contact 14, for example, to make the contact 14 to the SiC component 12 more ohmic or more schottky-like, or change the contact resistance, or improve the adhesion of the $Ti_3SiC_2$ material to the SiC. This approach has a drawback in that the junction 13 is less thermodynamically stable.

Electrical device 10 is suitable for use in the following technologies: high temperature SiC electronics, high power SiC electronics, and high temperature SiC microelectromechanical (MEMS) sensors (e.g., pressure, inertial, temperature, flow, chemical, fluidic sensors). Space and military applications for such devices include control, monitoring, and condition-based maintenance of aerospace propulsion systems and craft, and robust and radiation hard sensors for space exploration. Commercial applications include (a) instrumentation for turbine engines, (b) monitoring of combustion systems for efficiency and pollution control, (c) monitoring of corrosive chemicals (chemical production, semiconductor manufacturing equipment, etc.), (d) down-hole monitoring for oil and geothermal exploration.

Figure 2:
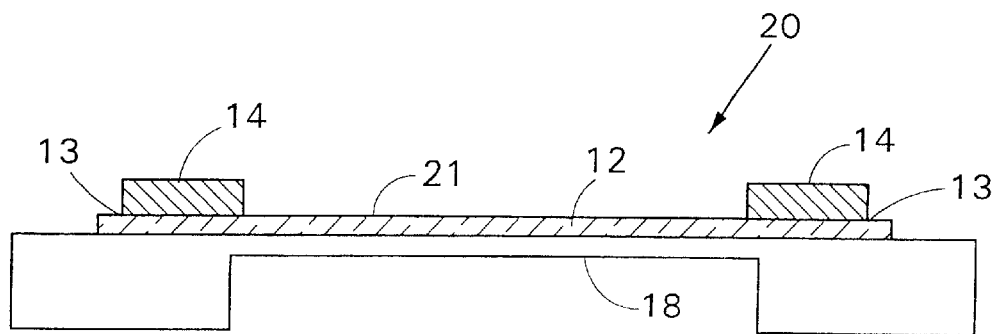
FIG. 2 is a schematic side view of an embodiment of the present invention depicting stable ohmic contacts on an SiC device or component, that is formed on a micromechanical structure, for example a membrane.

Referring to FIG. 2, electrical device 20 is an embodiment of the present invention where the SiC device or component 12 is a piezoresistor 12 that is on a substrate formed by a micromechanical structure 16, for example, a membrane 18. This configuration can be employed to form a sensor. Two stable $Ti_3SiC_2$ electrical contacts 14 are formed on the SiC piezoresistor 21 and form ohmic contacts for making electrical connection with device 20. Since the electrical contacts 14 are in thermodynamic equilibrium with the SiC piezoresistor 21, the contact resistance remains stable over time in high temperature environments. Although micromechanical structure 16 has been shown as having a membrane 18, it is understood that micromechanical structure 16 can be one of many micromechanical structures such as a cantilevered beam, microbridge, tethered proof mass, etc., to form a variety of different types of sensors, actuators or other devices.

Figure 3:
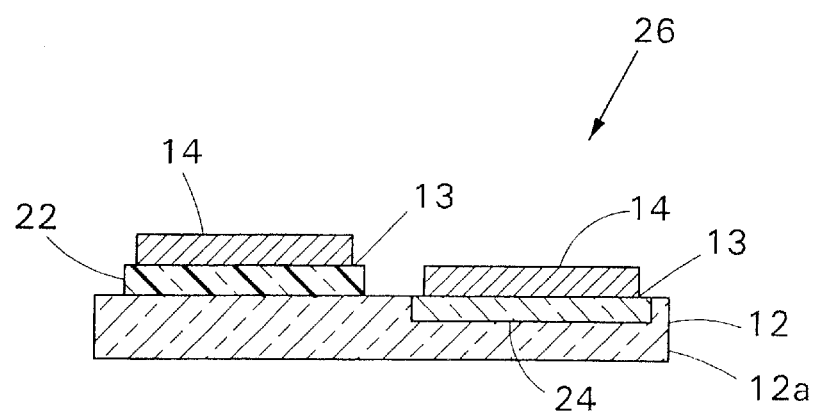
FIG. 3 is a schematic side view of another embodiment of the present invention depicting stable ohmic contacts on an SiC p-n diode.

Referring to FIG. 3, electrical device 26 is another embodiment of the present invention in which electrical device 26 is an SiC p-n diode. The SiC component 12 includes a doped n-SiC underlying layer 12a over which a heavily doped $p^+$-SiC epitaxial layer 22 is formed over a portion of the underlying layer 12a to form a mesa. A heavily doped $n^+$-SiC region or layer 24 is also implanted into the underlying layer 12a. Two stable $Ti_3SiC_2$ ohmic electrical contacts 14 are formed over at least a portion of respective layers 22 and 24. Layer or region 24 provides improved contact resistance. The SiC/contact junctions 13 are located between the electrical contacts 14 and layers or regions 22/24.

Figure 4:
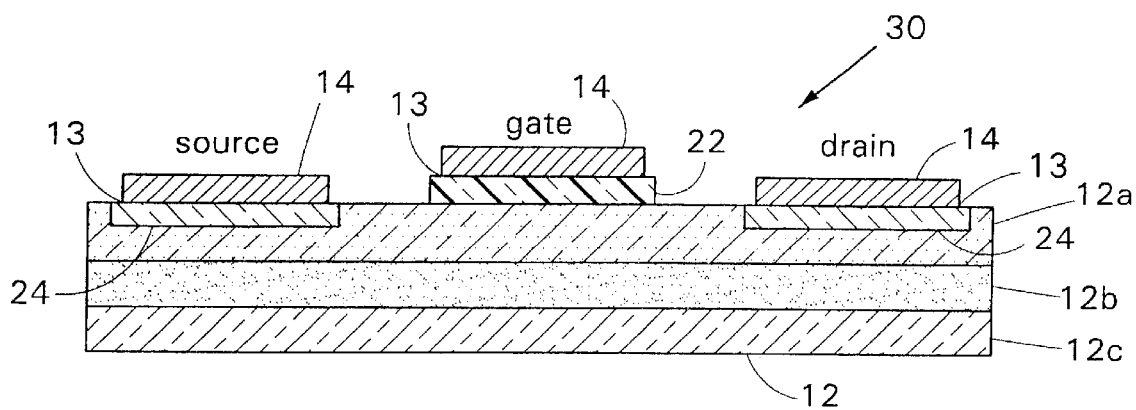
FIG. 4 is a schematic side view of still another embodiment of the present invention depicting stable electrical contacts on an SiC junction field effect transistor (JFET).

Referring to FIG. 4, electrical device 30 is still another embodiment of the present invention in which electrical device 30 is an SiC junction field effect transistor (JFET). The SiC component 12 includes a doped n-SiC underlying layer 12a formed on a doped p-SiC buffer layer 12b which in turn is formed on a doped n-SiC substrate 12c. Two heavily doped $n^+$-SiC regions 24 are implanted into the underlying layer 12a for improved contact resistance. A heavily doped $p^+$-SiC epitaxial layer 22 is formed over a portion of the underlying layer 12a to form a mesa between the implanted regions 24. Three stable $Ti_3SiC_2$ electrical contacts 14 are formed over at least a portion of respective layers or regions 22/24, resulting in a source, gate and drain, as shown.

Figure 5:
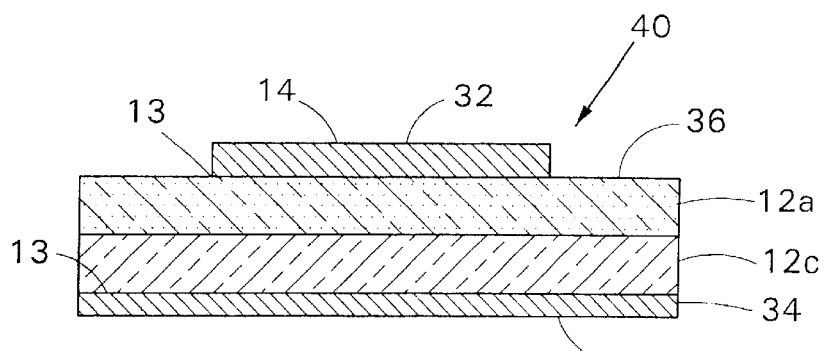
FIG. 5 is a schematic side view of yet another embodiment of the present invention depicting a stable electrical contact on an SiC schottky diode.

Referring to FIG. 5, electrical device 40 is yet another embodiment of the present invention in which electrical device 40 is an SiC schottky diode. The SiC component 12 includes an underlying doped n-SiC layer 12a forming a drift layer 36 which is formed over a heavily doped n-SiC substrate 12c. A first stable electrical contact 14 formed of $Ti_3SiC_2$ is formed over a portion of the underlying SiC layer 12a, thereby forming a schottky contact 32. A second stable electrical contact 14 is formed on the opposite side of the SiC component 12 over the SiC substrate 12c, thereby forming an ohmic contact 34.

Figure 6:
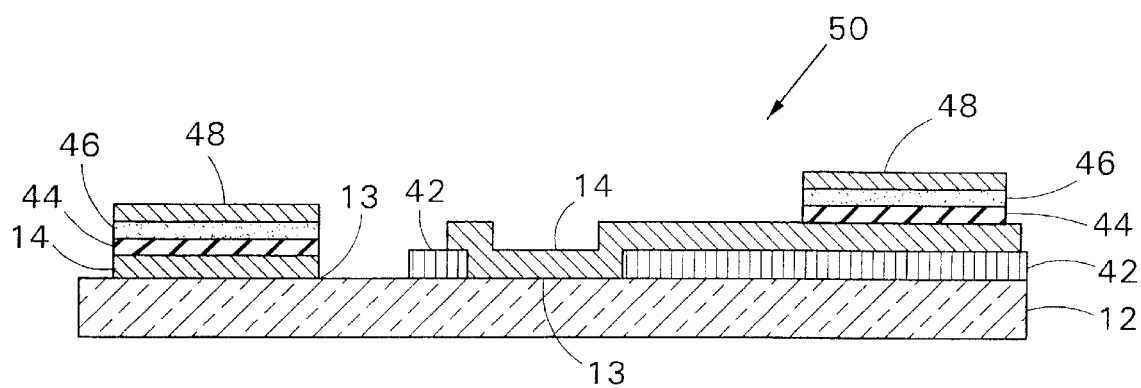
FIG. 6 is a schematic side view of another embodiment of the present invention depicting stable electrical contacts on an SiC layer with additional metallic layers formed thereon.

Referring to FIG. 6, electrical device 50 is another embodiment of the present invention in which additional metallic films are subsequently added to coat the electrical contacts. On the left-hand side of electrical device 50, a stable $Ti_3SiC_2$ electrical contact 14 is formed on the SiC component 12. A diffusion barrier metallic layer 44 is formed over the electrical contact 14, a metallic adhesion layer 46 is formed on the diffusion barrier layer 44 and a bondable metallic layer 48 is formed on the adhesion layer 46. Each layer 44, 46 and 48 on the electrical contact 14 is formed of a material that is generally non-reactive with the adjoining layer or layers. The diffusion barrier layer 44 virtually eliminates any reaction between the electrical contact 14 and the films deposited thereon. The adhesion layer 46 promotes adherence of further deposited films. The bondable layer 48 allows bonding of wire electrical leads, flip chip bump bonding or eutectic bonding for packaging. A second stable $Ti_3SiC_2$ electrical contact 14 is at the right-hand side of electrical device 50 and has a portion with metallic layers formed thereon with a top bondable layer 48 which is similar to that on the left-hand contact 14. The right-hand side contact 14 further includes a conductive trace extending laterally and contacting another part of the SiC component 12. A dielectric insulating layer 42 is formed between portions of the SiC component 12 and the electrical contact 14 and is generally non-reactive with either.

Platinum (Pt), gold (Au) and palladium (Pd) are typical materials for forming the bondable layer 48 with chromium and titanium being common materials for forming the adhesion layer 46 for platinum and gold. Titanium carbide (TiC), titanium nitride (TiN), tantalum nitride (TaN) and palladium (Pd) are typical materials for forming diffusion barrier layer 44 and silicon dioxide ($SiO_2$) and silicon nitride ($Si_3N_4$) are typical materials for forming dielectric layer 42. Other metallic layers can be employed to reduce the sheet resistance of the conductive layers, protect the $Ti_3SiC_2$ contact 14 from environments that the contact 14 is not sufficiently stable in, increase reflectivity, or change other properties of the surface.

While this invention has been particularly shown and described with references to preferred embodiments thereof, it will be understood by those skilled in the art that various changes in form and details may be made therein without departing from the scope of the invention encompassed by the appended claims. For example, it is understood that the electrical contacts 14 in the present invention can be deposited on any SiC component or device 12 and is not limited to those depicted and described herein. As a result, it is also understood that the resulting electrical device can be a wide variety of devices and is not limited to those depicted and described. The embodiments depicted in FIGS. 2–6 are illustrations of only some possible embodiments in the present invention. In addition, the SiC component 12, in some cases, may include materials therein or thereon other than described herein. Further, FIG. 6 depicts an example of how metallic films can be added and it is understood that, in many applications, configurations will be different than that shown.

What is claimed is:

1. An electrical contact for an SiC component comprising single phase deposited $Ti_3SiC_2$ material that is in thermodynamic equilibrium with SiC, wherein the electrical contact is one of an ohmic contact or a schottky contact.

2. The contact of claim 1 in which the $Ti_3SiC_2$ material further includes an element selected from the group consisting of Zr, Hf, Al, Ge, Cr, V, Nb, Ta, Mo, Sc, Ga, In, Tl, Sn, Pb, P, As, S, and N.

3. A semiconductor device comprising:
   a SiC component; and
   at least one electrical contact formed over at least a portion of the SiC component, the electrical contact comprising single phase deposited $Ti_3SiC_2$ material that is in thermodynamic equilibrium with SiC.

4. The device of claim/in which the $Ti_3SiC_2$ material further includes an element selected from the group consisting of Zr, Hf, Al, Ge, Cr, V, Nb, Ta, Mo, Sc, Ga, In, Tl, Sn, Pb, P, As, S, and N.

5. The device of claim 3 further comprising a substrate layer on which the SiC component is formed.

6. The device of claim 5 in which the substrate layer is a micromechanical structure.

7. The device of claim 3 in which the SiC component comprises a doped SiC epitaxial layer formed on a portion of an underlying SiC layer.

8. The device of claim 7 in which the doped epitaxial layer forms a mesa.

9. The device of claim 3 in which the SiC component comprises a doped SiC region implanted into an underlying SiC layer.

10. The device of claim 3 in which the SiC component comprises:
    an underlying SiC layer;
    at least one doped SiC region implanted in the underlying SiC layer;
    at least one doped epitaxial layer formed on a portion of the underlying SiC layer forming a mesa, wherein the at least one implanted SiC region and epitaxial layer each have an electrical contact thereon.

11. The device of claim 10 in which the SiC component further comprises:
    an SiC substrate; and
    an SiC buffer layer formed on the SiC substrate, the underlying SiC layer being formed over the SiC buffer layer.

12. The device of claim 3 further comprising at least one metallic layer formed over at least a portion of the at least one electrical contact.

13. The device of claim 12 in which the at least one metallic layer forms at least one of a bondable layer for bonding electrical leads thereto, a diffusion barrier for preventing reaction with the at least one electrical contact, and an adhesion layer for promoting adherence of films deposited thereon.

14. The device of claim 3 in which the SiC component has an electrical contact on opposite sides thereof, the SiC component comprising an SiC epitaxial layer formed on an SiC substrate.

15. The device of claim 3 in which the electrical contact is an ohmic contact.

16. The device of claim 3 in which the electrical contact is a schottky contact.

17. A method of forming an electrical contact for an SiC component comprising depositing single phase $Ti_3SiC_2$ material that is in thermodynamic equilibrium with SiC on the SiC device, and further comprising forming the electrical contact into one of an ohmic contact or a schottky contact.

18. The method of claim 17 further comprising providing the $Ti_3SiC_2$ with an element selected from the group consisting of Zr, Hf, Al, Ge, Cr, V, Nb, Ta, Mo, Sc, Ga, In, Tl, Sn, Pb, P, As, S, and N.

19. A method of forming a semiconductor device comprising:
    providing a SiC component; and
    forming at least one electrical contact over at least a portion of the SiC component by depositing single phase $Ti_3SiC_2$ material that is in thermodynamic equilibrium with SiC.

20. The method of claim further comprising providing the $Ti_3SiC_2$ with an element selected from the group consisting of Zr, Hf, Al, Ge, Cr, V, Nb, Ta, Mo, Sc, Ga, In, Tl, Sn, Pb, P, As, S, and N.

21. The method of claim 19 further comprising forming the SiC component on a substrate layer.

22. The method of claim 21 further comprising forming the SiC component on a substrate layer that is a micromechanical structure.

23. The method of claim 19 further comprising forming the SiC component by forming a doped SiC epitaxial layer on a portion of an underlying SiC layer.

24. The method of claim 23 further comprising forming a mesa from the doped SiC epitaxial layer.

25. The method of claim 19 further comprising forming the SiC component by implanting a doped SiC region into an underlying SiC layer.

26. The method of claim 19 further comprising forming at least one metallic layer over at least a portion of the at least one electrical contact.

27. The method of claim 19 further comprising forming the at least one metallic layer into at least one of a bondable layer for bonding electrical leads thereto, a diffusion barrier for preventing reaction with the at least one electrical contact, and an adhesion layer for promoting adherence of films deposited thereon.

28. The method of claim 19 further comprising forming the electrical contact into an ohmic contact.

29. The method of claim 19 further comprising forming the electrical contact into a schottky contact.

30. A semiconductor device comprising:
    an SiC component formed on a substrate layer, the substrate layer being a micromechanical structure; and
    at least one electrical contact formed over at least a portion of the SiC component, the electrical contact comprising $Ti_3SiC_2$ material that is in thermodynamic equilibrium with SiC.

31. A semiconductor device comprising:
    an SiC component comprising a doped SiC epitaxial layer formed on a portion of an underlying SiC layer; and
    at least one electrical contact formed over at least a portion of the SiC component, the electrical contact comprising $Ti_3SiC_2$ material that is in thermodynamic equilibrium with SiC.

32. A method of forming a semiconductor device comprising:

providing an SiC component formed on a substrate layer, the substrate layer being a micromechanical structure; and forming at least one electrical contact over at least a portion of the SIC component by depositing $Ti_3SiC_2$ material that is in thermodynamic equilibrium with SiC.

33. A method of forming a semiconductor device comprising:

providing an SiC component comprising a doped SiC epitaxial layer formed on a portion of an underlying SiC layer; and forming at least one electrical contact over at least a portion of the SiC component by depositing $Ti_3SiC_2$ material that is in thermodynamic equilibrium with SiC.

* * * * *

UNITED STATES PATENT AND TRADEMARK OFFICE
CERTIFICATE OF CORRECTION

PATENT NO. : 6,544,674 B2
DATED : April 8, 2003
INVENTOR(S) : Harry L. Tuller, Marlene A. Spears and Richard Mlcak It is certified that error appears in the above-identified patent and that said Letters Patent is hereby corrected as shown below:

<u>Title page</u>,
Item [75], the inventor name "Richard Micak" is misspelled and should be replaced with the proper spelling -- Richard Mlcak --.

<u>Column 7</u>,
Line 25, delete "claim/in" and insert -- claim 3 in --.

<u>Column 8</u>,
Line 21, after "claim" insert -- 19 --.

Signed and Sealed this

Twelfth Day of August, 2003

JAMES E. ROGAN
*Director of the United States Patent and Trademark Office*